United States Patent [19]

Takeda et al.

[11] Patent Number: 5,604,808
[45] Date of Patent: Feb. 18, 1997

[54] FM SIGNAL PROCESSOR

[75] Inventors: Isoshi Takeda; Yoshikazu Shimada, both of Kyoto, Japan

[73] Assignee: Rohm Co., Ltd., Kyoto, Japan

[21] Appl. No.: 338,771

[22] Filed: Nov. 10, 1994

[30] Foreign Application Priority Data

Nov. 10, 1993 [JP] Japan .................................. 5-281195

[51] Int. Cl.$^6$ ............................................................ H04H 5/00
[52] U.S. Cl. ................................. 381/7; 331/20; 331/25; 329/323
[58] Field of Search ................................. 455/214, 258, 455/260, 262, 263, 264; 331/20, 25, 22; 329/323, 325, 326, 328; 381/4, 7

[56] References Cited

U.S. PATENT DOCUMENTS

| | | | |
|---|---|---|---|
| 4,631,499 | 12/1986 | Kasperkovitz | 331/22 |
| 4,817,167 | 3/1989 | Gassmann | 381/7 |
| 5,038,115 | 8/1991 | Myers et al. | 331/25 |
| 5,257,312 | 10/1993 | Therssen et al. | 381/7 |
| 5,293,135 | 3/1994 | McGinn | 455/214 |
| 5,341,107 | 8/1994 | Bijker et al. | 455/214 |
| 5,357,544 | 10/1994 | Horner et al. | 381/7 |
| 5,440,586 | 8/1995 | Den Braber | 455/260 |
| 5,493,713 | 2/1996 | Horsfall et al. | 455/260 |

*Primary Examiner*—Forester W. Isen
*Attorney, Agent, or Firm*—Nikaido, Marmelstein, Murray & Oram LLP

[57] ABSTRACT

An FM signal phase-shifted by 90° and an FM signal not phase-shifted are supplied to a multiplier to demodulate a stereo composite signal. A 90° phase shifting circuit has a first oscillation circuit whose phase shift amount varies according to a timing at which the amount of a current flowing through a charging and discharging capacitor is changed. A multiplexer is provided to process the stereo composite signal to output left and right channel signals. The multiplexer has a second oscillation circuit for generating a signal multiplied by the stereo composite signal to extract the left and right channel signals from the composite signal. The first and second oscillation circuits each have a differential amplifier. The constant current of the constant current source of each differential amplifier is set by trimming-regulate it by a regulating circuit.

3 Claims, 11 Drawing Sheets

Fig. 9(a)
POINT(e)
VOLTAGE
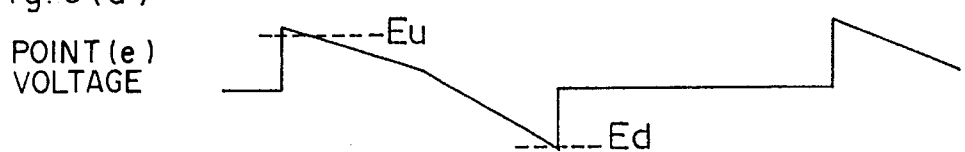
Eu
Ed
Fig. 9(b)
POINT(f)
VOLTAGE
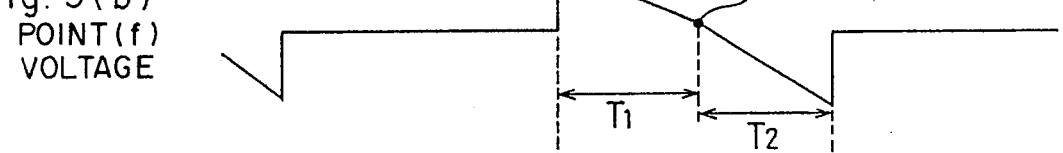
K
T1   T2
Fig. 9(c)
FM INPUT
SIGNAL
Fig. 9(d)
OUTPUT
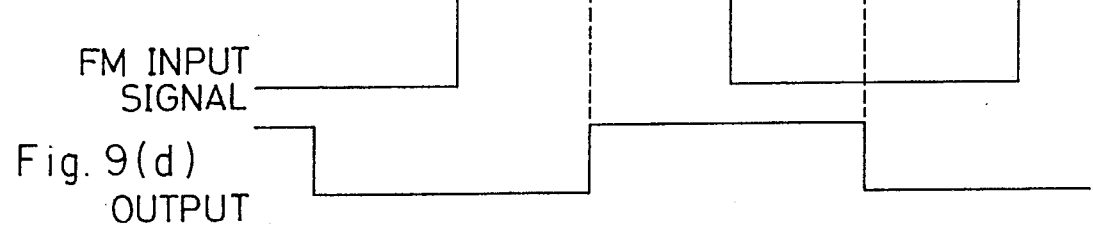

FM SIGNAL PROCESSOR

BACKGROUND OF THE INVENTION

1. Field of the Invention

The present invention relates to a processor for processing an FM signal such as an FM stereo signal.

2. Description of the Prior Art

Referring to FIG. 1, there is shown a block diagram of the entire arrangement of an FM stereo radio receiver. Reference numeral 331 represents an antenna. Reference numeral 332 represents an RF amplifier. Reference numeral 333 represents an mixer for mixing an oscillation signal of a local oscillation circuit 334 and an RF signal from the RF amplifier 332 to output an IF signal. Reference numeral 335 represents an IF filter. Reference numeral 336 represents an IF amplifying circuit. Reference numeral 337 represents a limiter. Reference numeral 339 represents a 90° phase shifting circuit. Reference numeral 340 represents a multiplier serving as an FM detector. Reference numeral 341 represents a multiplexer. Reference numeral 342 represents a power amplifying circuit. Reference numerals 343 and 344 represent left and right speakers.

The IF amplifier 336, the limiter 337, the 90° phase shifting circuit 339, the multiplier 340 and the multiplexer 341 are formed in a one-chip IC device 338. To the 90° phase shifting circuit 339, an resonance circuit 345 including a coil L and a capacitor C is externally attached, and to the multiplexer 341, a circuit 347 constituting a part of a voltage controlled oscillator (VCO) 346 is externally attached. The circuit includes a resistor and a capacitor.

In this FM radio receiver, the frequency of a received FM radio signal is converted into an intermediate frequency (IF) by the IF circuit 336, and the amplitude thereof is made constant by the limiter 337. Thereafter, the signal is transmitted through a line a directly to the multiplier 340 and is also transmitted through a line b to the multiplier 340 by way of the phase shifting circuit 330 where its phase is shifted by 90°. These two signals are multiplied at the multiplier 340. The phase shifting circuit 339 shifts the phase by the capacitor C and the coil L. The VCO 346 used in the multiplexer 341 is designed to regulate a free-running oscillation frequency by a CR time constant of a circuit externally attached to the IC device 338.

Referring to FIG. 2, there is shown another conventional FM radio receiver where ceramic resonators 350 and 351 are externally attached instead of the resonance circuit 345 and the circuit 347 of FIG. 1. In a phase shifting circuit 339 using the ceramic resonator 350, as shown in FIG. 3, three resistors R and the ceramic resonator 350 form a Wheatstone bridge, and the phase of the signal is shifted by using a reactance component of the ceramic resonator 350. The oscillation frequency of the VCO 346 depends on the ceramic resonator 351.

However, in the phase shifting circuit 339 of FIG. 1, it is necessary to adjust a free-running oscillation frequency by the capacitor or the coil, and the regulation which is a mechanical regulation is liable to deterioration with age. In addition, since the coil cannot be formed in an integrated circuit (IC) device, more number of terminal pins are required and an externally-connected part is required. The VCO 346 has similar disadvantages since the free-running oscillation frequency is regulated by a CR time constant of a circuit externally attached to the IC device.

When the ceramic resonators 350 and 351 are externally attached as shown in FIG. 2, not only an externally-attached part is required but also the part (ceramic resonator) is not available in some countries since it is a special part. In addition, the ceramic resonator is inferior to the former method in property, and difficult to match with an IC device. Further, since the free-running frequency of the VCO 346 depends on only the property of the resonator 351, to obtain a comparatively low frequency such as 19 kHz and 38 kHz necessary to process a composite signal, a number of frequency dividers are required for dividing (into 24 and into 12) 456 kHz of the ceramic resonator 351. This increases the chip area of the IC device.

SUMMARY OF THE INVENTION

An object of the present invention is to provide an FM signal processor which requires no externally-attached part and frequency adjustment thereof is completed in an IC device.

An FM signal processor of the present invention is provided with the following: a multiplier for demodulating a stereo composite signal; a first line for supplying the FM signal to the multiplier; a second line for supplying an FM signal phase-shifted by 90° to the multiplier; a 90° phase shifting circuit provided on the second line, said 90° phase shifting circuit having a first oscillation circuit whose phase shift amount varies according to a timing at which an amount of a current flowing through a charging and discharging capacitor is changed; a multiplexer for processing the stereo composite signal demodulated by the multiplier to output left and right channel signals, said multiplexer having a second oscillation circuit of a voltage control type for generating a signal multiplied by the stereo composite signal to extract the left and right channel signals from the composite signal; and a trimming circuit for setting a constant current of a constant current source of a differential amplifier constituting a part of the first oscillation circuit and a constant current of a constant current source of a differential amplifier constituting a part of the second oscillation circuit, said trimming circuit being connected to the constant current source of each of the differential amplifiers.

BRIEF DESCRIPTION OF THE DRAWINGS

This and other objects and features of this invention will become clear from the following description, taken in conjunction with the preferred embodiments with reference to the accompanied drawings in which:

FIG. 9 is a waveform chart of assistance in explaining operations of the charging and discharging current controlling circuit and the output circuit;

DESCRIPTION OF THE PREFERRED EMBODIMENTS

Figure 1:
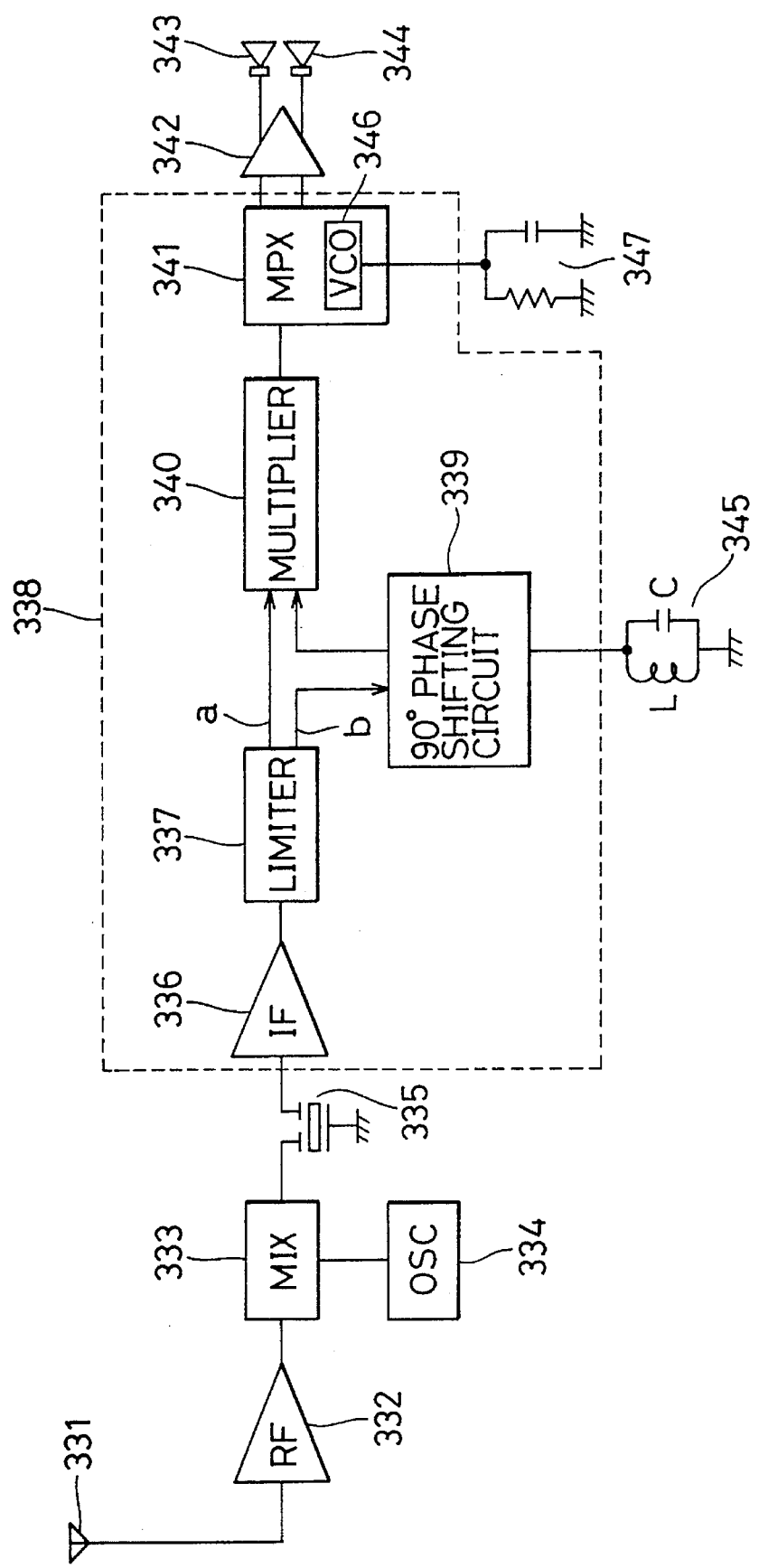
FIG. 1 is a block circuit diagram of a conventional stereo radio receiver.
Figure 2:
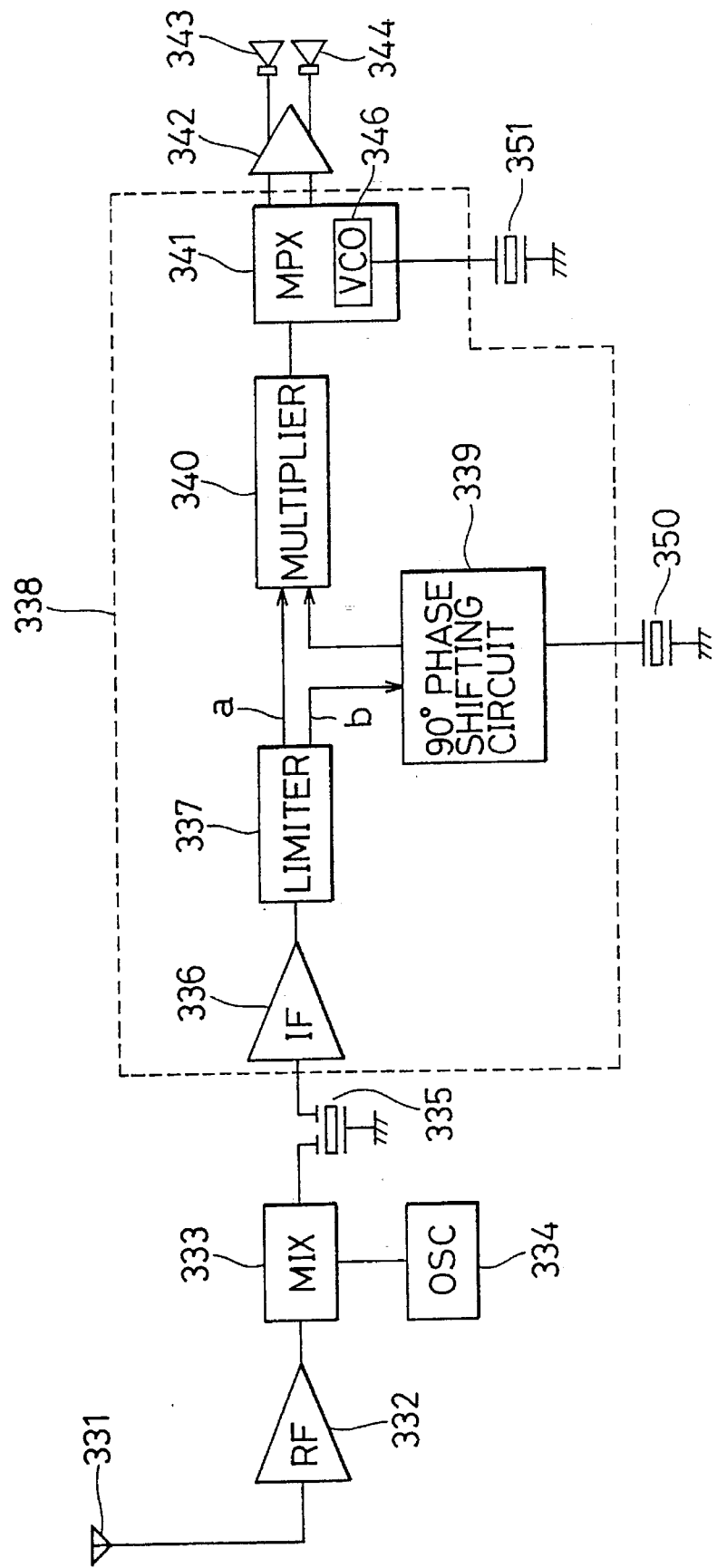
FIG. 2 is a block circuit diagram of another conventional stereo radio receiver.
Figure 3:
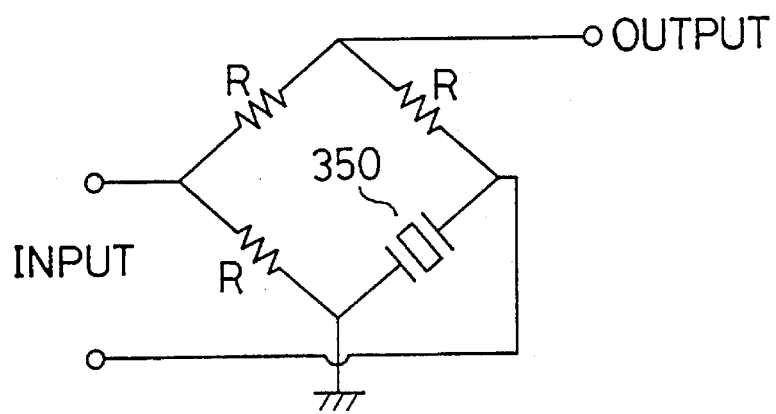
FIG. 3 is a detail view of a part of the circuit of FIG. 2.
Figure 4:
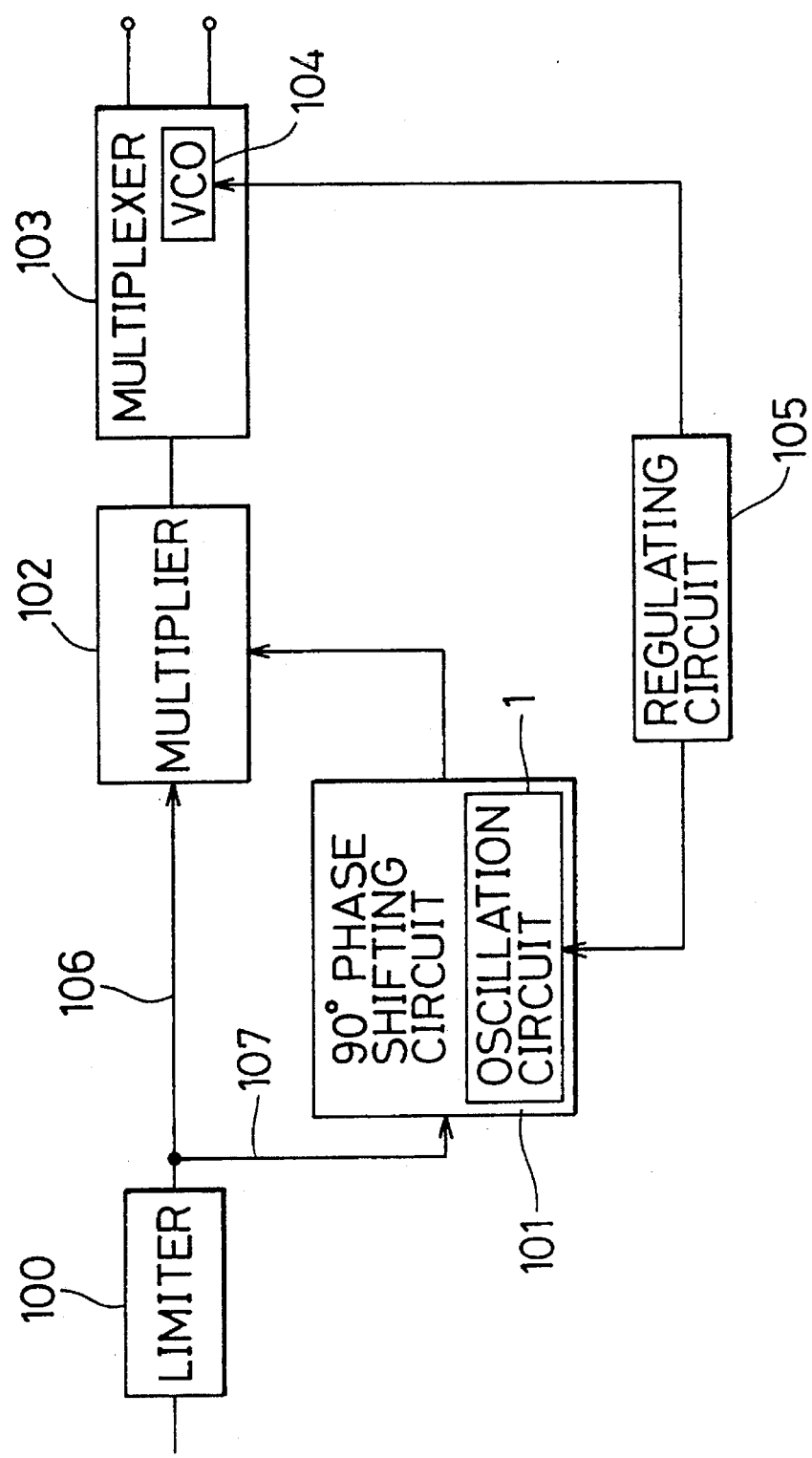
FIG. 4 is a block circuit diagram of a principal portion of an FM radio receiver embodying the present invention.

Hereinafter, the present invention will be described with reference to an embodiment shown in the drawings. Referring to FIG. 4, there is shown a relevant portion of an FM radio receiver embodying the present invention. Reference numeral 100 represents a limiter which limits the amplitude of an IF signal from the IF circuit to a predetermined amplitude. Reference numeral 101 represents a 90° phase shifting circuit which shifts the phase of an output of the limiter 100 by 90°. Reference numeral 102 represents a multiplier which multiplies an FM signal supplied from the limiter 100 through a line 106 and an FM signal whose phase is shifted by the 90° phase shifting circuit 101 on a line 107 to demodulate a stereo composite signal. Reference numeral 103 represents a multiplexer having a VCO 104. Reference numeral 105 represents a regulating circuit which regulates a free-running frequency of an oscillation circuit provided in the 90° phase shifting circuit 101 and a free-running frequency of the VCO 104. The circuit of FIG. 4 is formed in a one-chip IC device.

Figure 5:
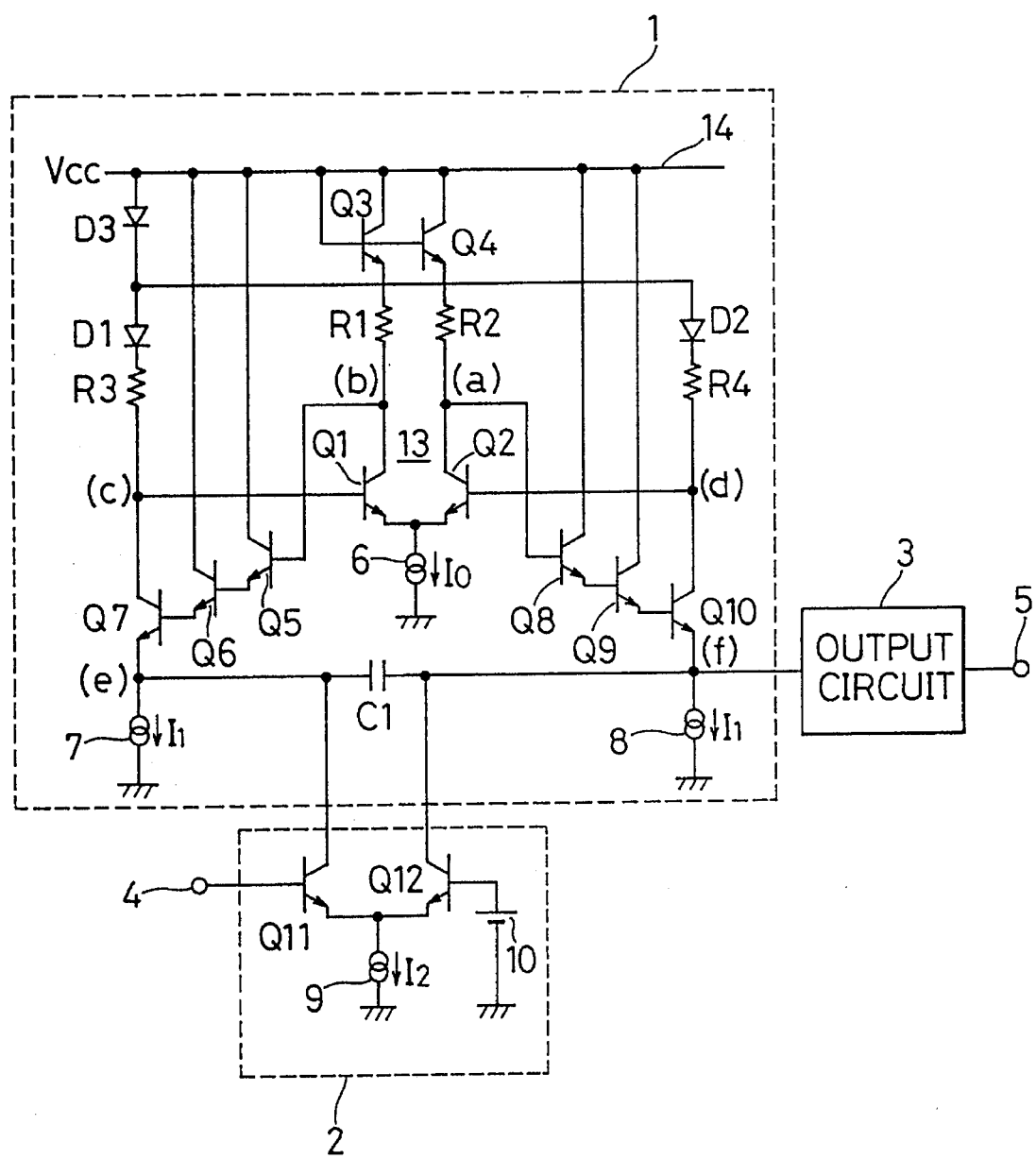
FIG. 5 is a circuit diagram of a 90° phase shifting circuit of the FM radio receiver.

Referring to FIG. 5, there is shown details of the phase shifting circuit 101. Reference numeral 1 represents an oscillation circuit. Reference numeral 2 represents a charging and discharging controlling circuit which controls the values of charging and discharging currents of a capacitor C1 of the oscillation circuit 1 so as to change in the middle of the charging and discharging based on an input signal. Reference numeral 3 represents an output circuit which forms an output of the oscillation circuit 1. Reference numeral 4 represents an input terminal for supplying an input signal (FM signal) thereto. Reference numeral 5 is an output terminal. Although described later in detail, in the phase shifting circuit of FIG. 5, the amount of the shift of the phase depends on the point of variation in charging and discharging currents of the capacitor C1. The circuit setting is made so that the phase is shifted by 90° for an input signal of a predetermined frequency. To be specific, the shift amount is 90° at the center frequency (i.e. carrier frequency) of the FM signal. In this case, the oscillation circuit 1 is designed so that its oscillation frequency is the center frequency of the FM signal.

The oscillation circuit 1 has a differential amplifying circuit 13 including a pair of differential transistors Q1 and Q2, their loading resistors R1 and R2, transistors Q3 and Q4 and a constant current source 6. One output of the differential amplifying circuit 13 is supplied from the collector of the transistor Q1 by way of Darlington-connected transistors Q5 and Q6 to the base of a transistor Q7, and the other output is supplied from the collector of the transistor Q2 by way of Darlington-connected transistors Q8 and Q9 to the base of a transistor Q10. The emitter of the transistor Q7 is connected to a constant current source 7 and to one end of the capacitor C1.

The collector of the transistor Q7 is connected by way of diodes D1 and D3 to a power supply line 14 of a voltage VCC, and to the base of the transistor Q1. Likewise, the collector of the transistor Q10 is connected by way of a resistor R4 and diodes D2 and D3 to the power supply line 14, and to the base of the transistor Q2. The emitter of the transistor Q10 is connected to a constant current source 8 and to the other end of the capacitor C1.

To the ends of the capacitor C1, the collectors of the differential transistors Q11 and Q12 forming the charging and discharging control circuit 2 are connected. The emitters of the differential transistors Q11 and Q12 are connected to a constant current source 9. The base of the differential transistor Q11 is connected to the input terminal 4, and the base of the differential transistor Q12 is connected to a constant voltage source 10.

Figure 7:
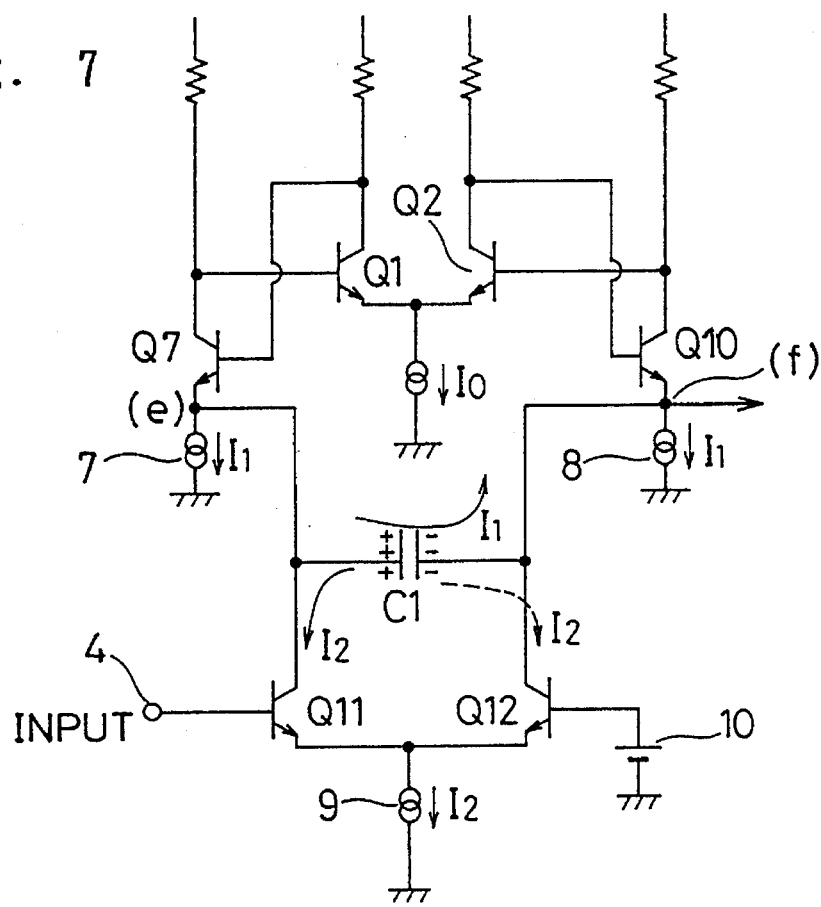
FIG. 7 is a circuit diagram of assistance in explaining an operation of a charging and discharging current controlling circuit of the phase shifting circuit.
Figure 8:
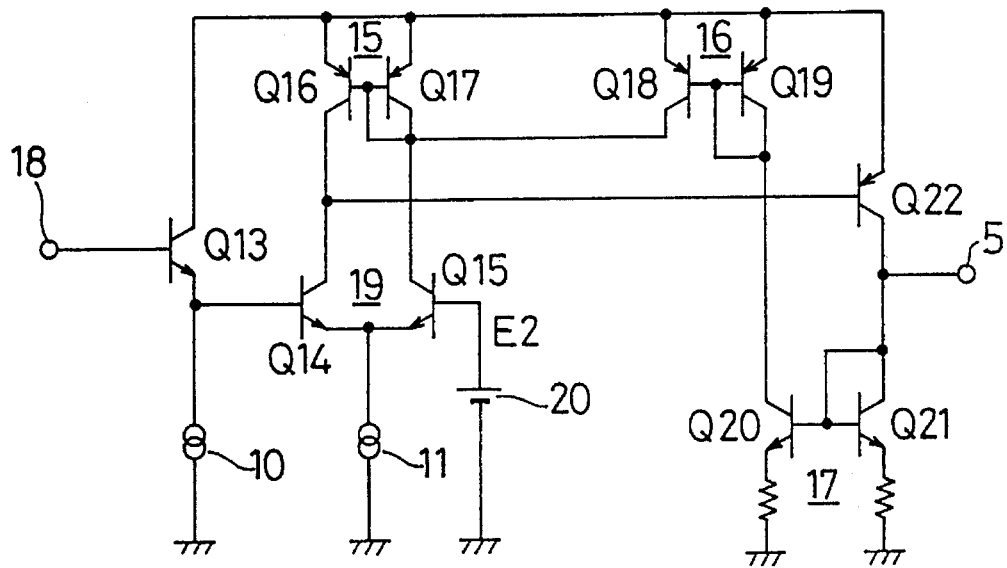
FIG. 8 is a circuit diagram of an output circuit of the phase shifting circuit of FIG. 5.

The output circuit 3 includes, as shown in FIG. 7 in detail, an emitter follower Q13 connected to one end of the capacitor C1 so as to receive an output of the oscillation circuit 1, differential transistors Q14 and Q15 which receive an output of the emitter follower Q13, constant current sources 10 and 11, current mirror circuits 15, 16 and 17, and a transistor Q22.

In describing the operation of the circuit of FIG. 5, first, only the operation of the oscillation circuit 1 will be described with reference to a time chart of FIG. 6. When the circuit of FIG. 5 is stable, the voltage of each point is as shown in a period (A) of FIG. 6. In actuality, however, an extremely slight offset is generated. Assume now that the potential at a point (d) is higher than the potential at a point (c). Then, the currents flowing to the transistors Q1 and Q2, respectively, have offsets $(I_0/2)-\Delta i$ and $(I_0/2)+\Delta i$ from $I_0/2$.

First, the side of the point (c) will be considered. The current flowing to the transistor Q1 decreases to increase the voltage at a point (b). That is, from $V_{CC}-V_F-R_0I_0/2$, $V_{CC}-V_F-R_0(I_0/2-\Delta i)$. This potential difference is transmitted to the transistors Q5, Q6 and Q7 in this order, so that the current flowing to the transistor Q7 increases. Since the voltage at the point (c) further decreases, an initial offset is amplified by a positive feedback, so that the potential difference between the points (c) and (d) increases. In addition, since of the currents flowing to the transistor Q7, the current exceeding $I_1$ is charged to the capacitor C1, the potential at a point (e) also increases. Likewise, since a current less than $I_1$ flows to the transistor Q10 and the shortage from $I_1$ is supplied from the capacitor C1, the potential at a point (f) decreases (see a transient period represented by a period (B) which occurs after the power is turned on).

During the period (B), the potential at the point (b) increases up to not more than $V_{CC}-V_F$. At this time, the potentials at the points (a) and (f) are $V_{CC}-V_F-R_0I_0$ and $V_{CC}-4V_F-R_0I_0$, respectively, and the difference in potential between the points (a) and (f) is $3V_F$, so that the transistors Q8 to Q10 are activated to decrease the potential at the point (d) and increase the potential at the point (a) by $R_0I_0$. Thereby, the potential at the point (f) increases by $R_0I_0$ at a stretch. With this increase, the potential at the point (e) increases by $R_0I_0$. However, since the potential at the point (b) decreases because of the decrease in potential at the point (d), the transistors Q5 to Q7 cannot secure a base-emitter activation voltage $V_F$ and are cut-off (see the transition from the period (B) to a period (C)).

Since the transistor Q7 is thus cut-off, the potential at the point (e) is $I_1$ and the capacitor C1 is discharged, so that the potential at the point (e) drops by $I_1t/C_1$ (t represents time). At this time, since the potentials at the points (a) to (d) do not change, the potential at the point (f) is maintained $V_{CC}-4V_F$ (period (C)).

When the potential at the point (e) decreases to $V_{CC}-4V_F-R_0I_0$, the potential between the points (b) and (e) becomes $3V_F$ to activate the transistors Q5 to Q7, so that the potential at the point (c) decreases and the potential at the point (b) increases by $R_0I_0$. Since the point (e) is clamped at a potential lower than the potential at the point (b) by $-3V_F$, the potential at the point (e) is increased by $R_0I_0$. This means that the potentials at the both ends of the capacitor C1 do not change since the increase in the potential at the point (e) occurs during a very short period of time when no currents flow into and out of the capacitor C1. Therefore, the potential at the point (f) also increases by $R_0I_0$. At this time, since the potential at the point (c) decreases, the potential at the point (a) decreases, so that the transistors Q8 to Q10 are cut-off (transition from the period (C) to a period (D)).

During the period (D), the potential at the point (f) drops by $I_1t/C_1$ like during the period (C). When the potential at the point (f) decreases to $V_{CC}-4V_F-R_0I_0$, the potential $3V_F$ is secured between the points (a) and (f), so that the transistors Q8 to Q10 are activated and the transistors Q5 to Q7 are cut-off. A period (E) is similar to the period (C).

Figure 6:
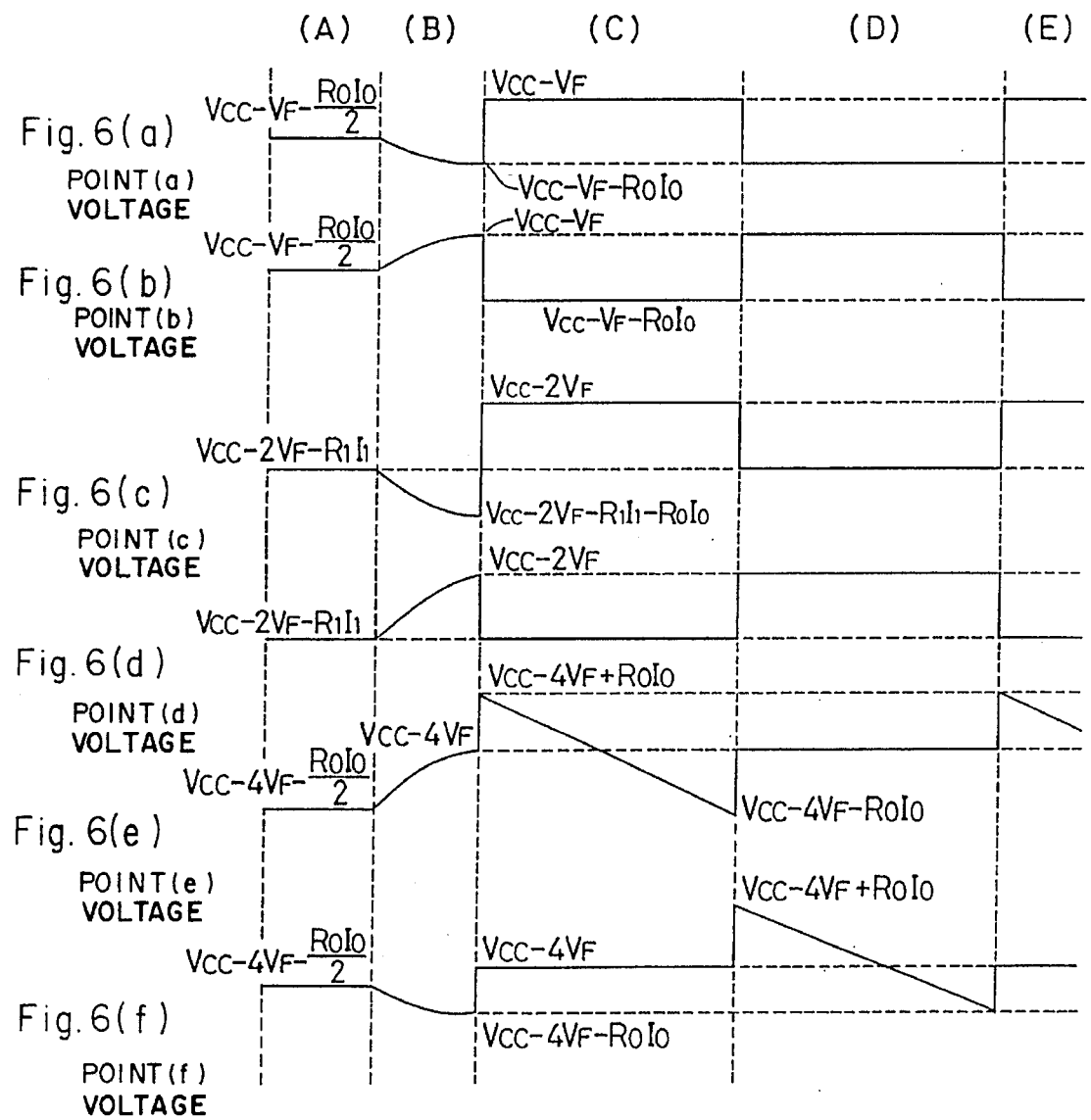
FIG. 6 is a waveform chart of assistance in explaining an operation of an oscillation circuit in the phase shifting circuit of FIG. 5.

As described above, in the operation by the oscillation circuit alone, the voltages at the points (e) and (f) at the both ends of the capacity C1 vary as shown at (e) and (f) of FIG. 6. This variation is an alternate repetition of the periods (C) and (D) of FIG. 6 in the stationary state. In other words, the oscillation circuit 1 generates to the both ends of the capacitor an oscillation signal having a constant level period (C) and a saw tooth wave period (D) alternately.

Subsequently, an operation will be described which is performed when the charging and discharging control circuit 2 is caused to work on the oscillation circuit 1. Here, the currents of the constant current sources 7 and 8 are represented by $I_1$, and the current of the constant current source 9 is represented by $I_2$. Between these currents, a relationship $I_1 > I_2$ holds. When the transistor Q7 is ON and the transistor Q10 is OFF, through the capacitor C1, the current $I_1$ flows in a direction shown in FIG. 7, so that the potential at the point (f) decreases. At this time, when an FM signal as shown in FIG. 9 is inputted to the input terminal 4, since the transistor Q11 is ON and the transistor Q12 is OFF during a period $T_1$ of the FM signal, the current $I_1$ flows rightward and the current $I_2$ flows leftward through the capacitor C1 during the period $T_1$. At this time, the current $I_2$ flows into the constant current source 9 by way of the transistor Q11.

During the period $T_2$, since the conditions of the transistors Q11 and Q12 are reversed, i.e. the transistor Q11 is OFF and the transistor Q12 is ON, through the capacitor C1, the current $I_2$ shown by the dotted line flows rightward during the period $T_2$ as well as the current $I_1$ flows rightward (the current $I_2$ flows by ways of the transistor Q12 to the current source 9).

Referring to the waveforms of FIG. 9, at (f), the inclination during the period $T_2$ is steeper than the inclination during the period $T_1$. When the charging and discharging control circuit 2 is absent, only the current $I_1$ flows to the capacitor C1. Compared to the case where the current $I_1$ flows, since a current $I_1-I_2$, i.e. a current smaller than $I_1$ flows during the period $T_1$, the inclination is less steep when the current $I_1-I_2$ flows than when only the current $I_1$ flows. On the other hand, during the period $T_2$, since a current $I_1+I_2$ which is greater than the current $I_1$ flows, the inclination is steeper than when only the current $I_1$ flows. The oscillation frequency of the oscillation circuit 1 is the same as the center frequency (carrier frequency) of the FM signal. The phase shifting circuit operates so that the relationship between (f) of FIG. 9 and the FM input signal (g) is the phase relationship as shown in FIG. 9. That is, $T_1$ equals $T_2$. $T_1$ does not equal $T_2$ immediately after the phase shifting circuit is activated since the phase of the FM input signal with respect to the phase of the oscillation signal is random. The phase shifting circuit is, however, automatically controlled to be operated so that $T_1$ equals $T_2$. The reason therefor is as follows. The period $T_2+T_1$ is a period during which only the current $I_1$ flows to the capacitor C1. If the reduction in charge due to the current $I_1-I_2$ is compensated for by the increase in charge due to the current $I_1+I_2$, the condition of the capacitor C1 is the same as that of the case where only the current $I_1$ flows. This condition is fulfilled if $T_1$ equals $T_2$. Thus, the circuit is automatically controlled so that $T_1$ equals $T_2$. However, if the frequency of the input signal deviates from the center frequency, $T_1$ does not equal $T_2$, and the amount of phase shift varies accordingly.

The voltage of (f) of FIG. 9 is shaped into a pulse waveform at the succeeding output circuit 3. In the output circuit shown in FIG. 7, the voltage at the point (f) is inputted to an input terminal 18. In a differential amplifying circuit 19 including the transistors Q14 and Q15, when no input is present, the transistor Q15 biased ($E_2$) by a direct current (DC) source 20 is ON and the transistor Q14 is OFF. Under this condition, since the current mirror circuit 15 is ON and the current outputted from the transistor Q16 is supplied to the base of the transistor Q22, the transistor Q22 is OFF, so that the current mirror circuit 17 is OFF and the current mirror circuit 16 is OFF. At this time, the level of the voltage at the output terminal 5 is low because of an association with a non-illustrated circuit connected thereto.

When a voltage higher than a threshold value Eu of the transistor Q14 is inputted under this condition, the transistor Q14 is activated in addition to the transistor Q15 which is ON. Consequently, the collector current of the transistor Q16 flows into the transistor Q14, and the transistor Q22 is activated so that the base current thereof also flows into the transistor Q14. The activation of the transistor Q22 changes the level of the output terminal 5 to high and activates the current mirror circuits 17 and 16 successively, so that the collector current of the transistor Q18 flows to the transistor Q15. The current of the current mirror circuit 15 decreases accordingly.

Since for this reason, the output current of the transistor Q16 is small even through the input voltage successively decrease during the period $T_1$ of FIG. 9, the transistor Q22 is not readily disabled. This condition is a hysteresis condition, and the level of the output terminal 5 is maintained high. When the input is further decreased to Ed, the transistors Q14 and Q22 are disabled to disable the current mirror circuits 17 and 16, so that the circuit is returned to the initial condition and the level of the output terminal 5 is changed to low. By the operation described above, a high-level pulse (see (h) of FIG. 9) is outputted to the output terminal 5 during the period $(T_1+T_2)$. The phase of the output is shifted by 90° from the phase of the input signal.

In this circuit, since the phase is shifted by 90° at a predetermined frequency (carrier frequency), when an input has a frequency different from the predetermined frequency, the points of change of the periods $T_1$ and $T_2$ shift rightward or leftward to change the length of the period $(T_1+T_2)$, so that the amount of the phase shift of the output for the input differs.

Figure 10:
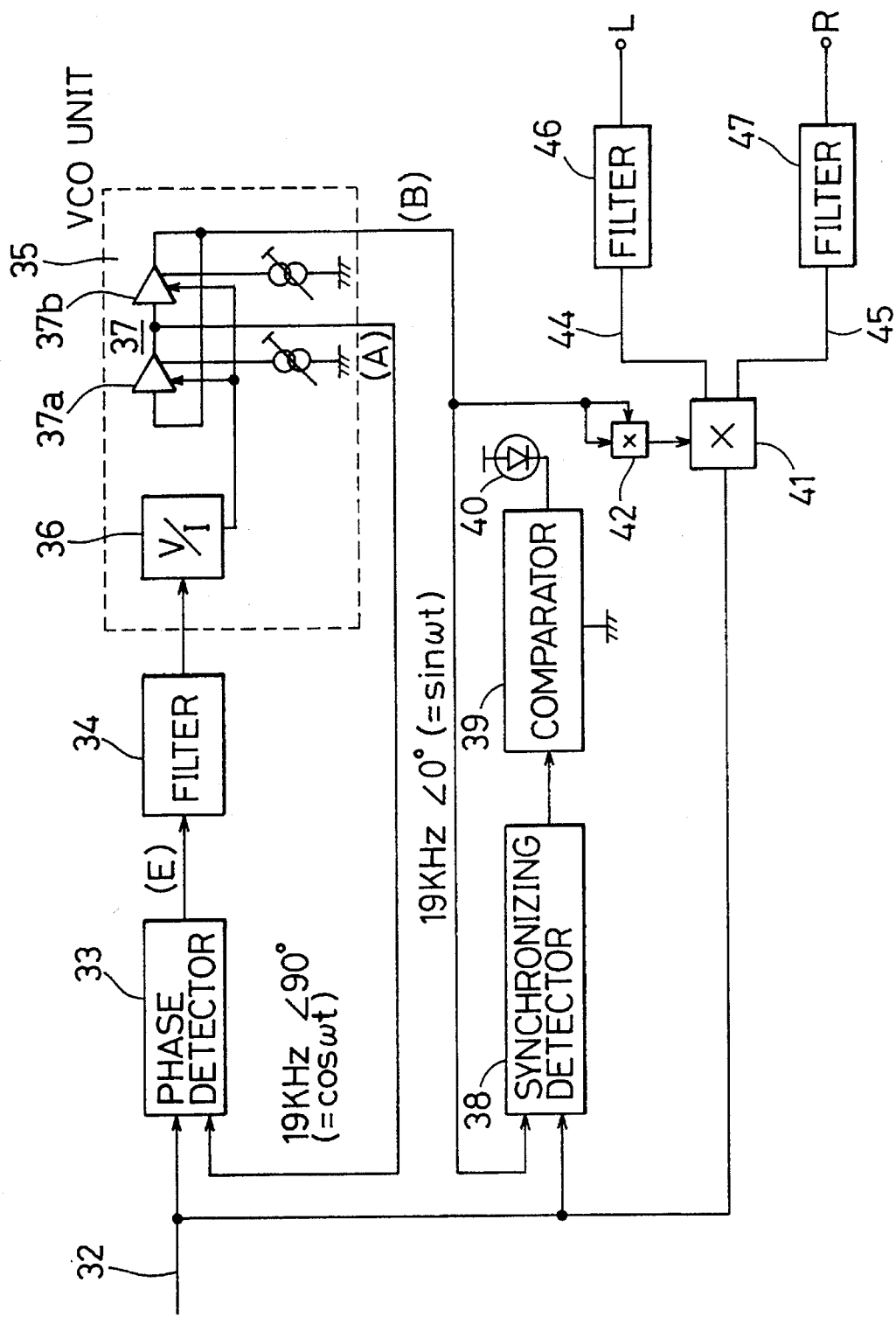
FIG. 10 is a block circuit diagram of a stereo multiplexer.

Referring to FIG. 10, there is shown the entire arrangement of a stereo multiplexer circuit. To this circuit, a stereo composite signal obtained by a monaural detection by the multiplier (detection circuit) 102 is inputted through a line 32. The stereo composite signal includes a band (L+R) signal of 50 Hz to 15 kHz, a pilot signal of 19 kHz and a (L−R) signal with 38 kHz as a carrier.

To a phase detector 33 to which the composite signal is supplied, an oscillation signal from a sinusoidal wave oscillating circuit 37 of a VCO unit 35 is supplied through another line. The sinusoidal wave oscillating circuit 37 is designed to perform free-running oscillation with 19 kHz as a target. However, since the oscillation frequency of the circuit 37 itself is shifted from 19 kHz, it is controlled to be an oscillation frequency of 19 kHz by an output of the phase detector 33.

The phase of a signal (A) supplied from the sinusoidal wave oscillating circuit 37 is shifted by substantially 90° from the pilot signal (19 kHz) included in the composite signal supplied to the phase detector 33. When the phase difference between the two signals is 90°, an error signal (E) detected and outputted by the phase detector 33 is 0. When the phase difference is shifted from 90°, a signal in accordance with the direction of the shift and the amount of the shift is outputted as an error signal (E).

After converted into a direct current by a filter 34, the error signal (E) is converted into a current by a voltage/current converter 36 of the VCO unit 35, and based on the current signal, the oscillation frequency of the sinusoidal wave oscillating circuit 37 is controlled so that the error signal (E) becomes 0. Thereby, the oscillation frequency of the sinusoidal wave oscillating circuit 37 becomes the correct value, i.e. 19 kHz. At that time, the phase of the output (A) of the sinusoidal wave oscillating circuit 37 is shifted from the phase of the pilot signal by 90°, and an output (B) is 0.

The sinusoidal wave oscillating circuit 37 including cascaded two filters 37a and 37b having time constants is designed to perform oscillation by feeding back outputs of the filters 37a and 37b to the input side and to control the time constants of the filters 37a and 37b by the error signal to vary the oscillation frequency. The specific arrangement of the sinusoidal wave oscillating circuit 37 will be described later in detail with reference to FIG. 11.

The output (B) of the sinusoidal wave oscillating circuit 37 is supplied to a synchronizing detector 38 and multiplied by the pilot signal included in the composite signal supplied from the input terminal 32. The output of the synchronizing detector 38 is compared with a predetermined reference value by a succeeding comparator 39. When the output is equal to or above than the reference value, a light emitting diode (LED) 40 is turned on to indicate that the received signal is a stereo broadcasting signal. When the output is below the reference value, the LED 40 is not turned on. Since the detection output of the synchronizing detector 38 is 0 when no pilot signal (19 kHz) is present in the signal supplied from the input line 32 (i.e. when it is not the stereo broadcasting), the LED 40 is not turned on.

The composite signal supplied to the line 32 is also supplied to a multiplier 41. To the multiplier 41, a sinusoidal wave of 38 kHz is supplied through another line. To obtain sinusoidal wave, the output (B) of the sinusoidal wave oscillating circuit 37 is squared by a multiplier 42 to take out a component of a frequency twice the sinusoidal wave oscillating frequency of 19 kHz. From the multiplier 41, an L signal and an R signal are outputted to lines 44 and 45, respectively. Since the pilot signal of 19 kHz is present on the outputs, the unnecessary component (i.e. the pilot signal) is cut by first and second filter circuits 46 and 47. The cut-off frequency of the filter circuits 46 and 47 is below 19 kHz.

Figure 11:
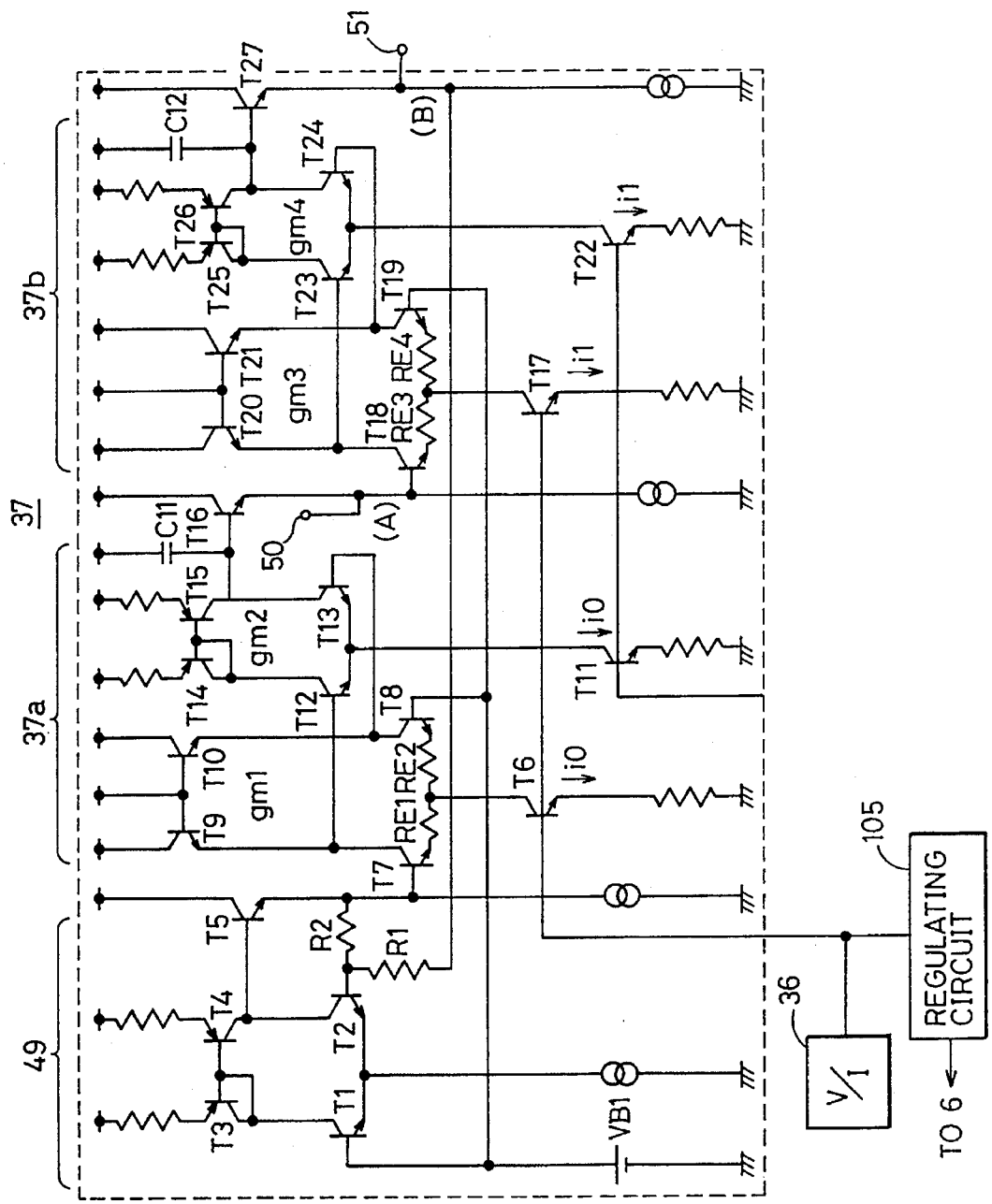
FIG. 11 is a circuit diagram of a VCO of the multiplexer.

Referring to FIG. 11, there is shown the details of the VCO unit 35. In addition to the filters 37a and 37b, the sinusoidal wave oscillating circuit 37 has an inverting amplifier 49 with an amplification degree of 1 which inverts the output of the filter 37b by 180° to supply it to the input side of the filter 37a. The filter 37a is formed as a low-pass filter including a pair of gm amplifiers gm1 and gm2 connected as shown in FIG. 11 and a capacitor C11. Likewise, the filter 37b is formed as a low-pass filter including a pair of gm amplifiers gm3 and gm4 and a capacitor C12.

The gm amplifiers gm1 to gm4 are all differential amplifiers. The output (B) of the output terminal 51 is inverted by the inverting amplifier 49 and inputted to the base of a transistor T7 of the gm amplifier with a phase different from the phase of the output (B) by 180°. The output of the gm amplifier gm1 is directed from the output of a transistor T15 of the succeeding gm amplifier gm2 to the emitter of an emitter follower T16. The phase at the emitter precedes the phase at the base of the transistor T7 by 90°.

After passing through the gm amplifiers gm3 and gm4, this signal is directed to the emitter side of an emitter follower T27. The phase at the emitter precedes the phase at the emitter of the transistor T16 by 90°. That is, one pair of gm amplifiers shifts the phase of input by 90° and produces an output. Therefore, the 180° phase shift is made by two pairs of gm amplifiers. Oscillation is realized by further inverting its output by 180° by the inverting amplifier 49 to feed back to the gm amplifier gm1. A terminal 50 is provided for taking an oscillation output therefrom.

When the capacity of the capacitors C11 and C12 are equal to each other (C11=C12=C) and emitter resistances RE1, RE2, RE3 and RE4 of the transistors T7, T8, T18 and T19 are equal to one another (RE1=RE2=RE3=RE4=RE), a free-running frequency of the sinusoidal wave oscillating circuit 37 is given by $$f_o = \frac{1}{2\pi} \cdot \frac{1}{RE \times C} \cdot \frac{i1}{i0} \quad (1)$$

Here, the capacity C of the capacitor can be prevented from being affected by temperature by making the capacitors C11 and C12 of a nitrided film. RE has a temperature characteristic. By appropriately choosing the temperature characteristic of i1/i0, the oscillation frequency $f_0$ has no temperature characteristic.

Since RE, C and i1/i0 in the above expression (1) vary according to non-uniformities of the elements constituting the circuit, each product has a different oscillation frequency $f_0$. The oscillation frequency $f_0$ is controlled to be the pilot frequency (19 kHZ) by the control loop shown in FIG. 4. However, when the non-uniformity of the sinusoidal wave oscillating circuit 37 is great, the control range is exceeded, so that it is impossible to make an oscillation at the pilot frequency.

Figure 12:
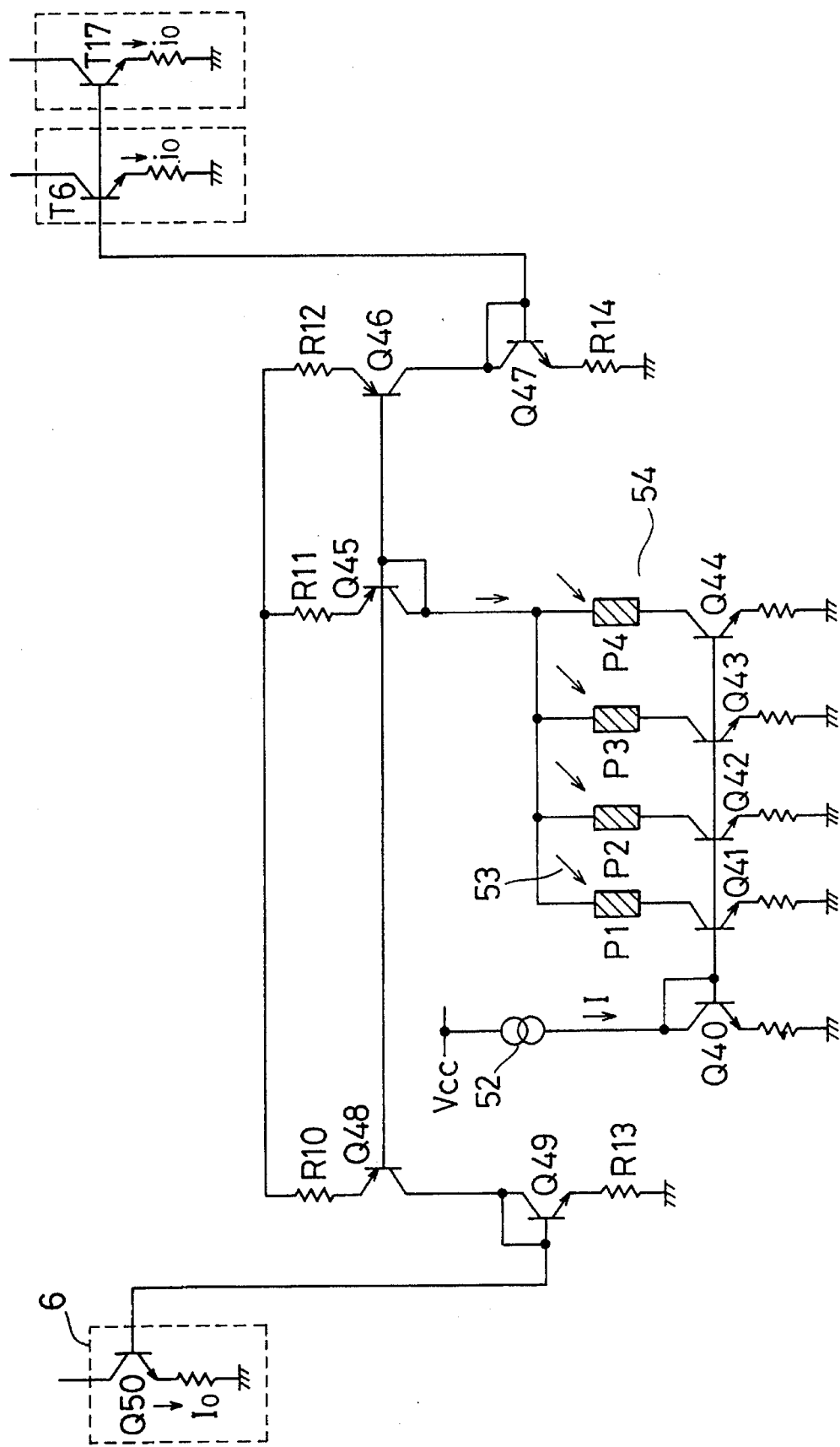
FIG. 12 is a circuit diagram of a regulating circuit of the multiplexer.

In this embodiment, a regulating circuit 105 is provided to restrain the non-uniformity by trimming the constant currents (constant currents at the time of the free-running oscillation) of the gm amplifiers gm1 and gm3. The regulating circuit 105 simultaneously regulates the constant current $I_0$ (see FIG. 5) of the oscillation circuit 1 of the 90° phase shifting circuit 101. The principal element constituting the regulating circuit 105 is a trimming circuit 54 (see FIG. 12). In FIG. 12, the entire of trimming circuit 54 is formed as a current mirror circuit. For an input side transistor Q40, four output side transistors Q41 and Q44 are provided. To the collectors of the output side transistors Q41 to Q44, conductor portions P1 to P4 are respectively connected as shown in FIG. 12. The other ends of the conductor portions P1 to P4 are all connected to the transistor Q45.

The conductor portions P1 to P4 can be cut by a laser beam 53, and the transistors corresponding to conductor portions which are cut are substantially excluded (i.e. set to be disabled). Since the currents of the output side transistors Q41, Q42, Q43 and Q44 are set to I, 2I, 4I and 8I for an input current I from the constant current source 52, by choosing a combination of operable transistors by the cutting of the conductor portions P1 to P4, one of I, 2I, 3I, 4I, 5I, ... 15I can be set as a total output current.

The present invention is not limited to the example of FIG. 12. Any number of output side transistors may be provided according to a required accuracy. Moreover, the current values of the transistors may be set to appropriate values. The output current set by the trimming circuit 54 is supplied by way of the transistors Q45, Q46 and Q47 to the bases of the transistors T6 and T17 of the VCO 104. The output current is also supplied by way of the transistors Q45, Q49 and Q49 to the base of a transistor Q50 constituting the constant current source 6 of the oscillation circuit 1 in the 90° phase shifting circuit 101.

Thus, the constant currents $i_0$ and $I_0$ of the transistors T6, T17 and Q50 become desired values. When the value of the constant current $i_0$ of the VCO and the value of the constant current $I_0$ of the 90° phase shifting circuit are different from the first, the output current of the trimming circuit 54 is supplied to the VCO and the 90° phase shifting circuit at a ratio of $i_0/I_0$. This ratio can be determined by resistors R10, R13, R12 and R14. Since the non-uniformities of the resistors and capacitors are in the same direction in the same IC device, the non-uniformities of the constant currents of the VCO and the phase shifting circuit are at the same ratio. Therefore, the output current of the trimming circuit is adjusted in accordance with the ratio of the constant current and supplied to the VCO and the phase shifting circuit.

As described above, according to the present invention, since the phase shifting circuit and the VCO do not use a capacitor and a coil or a ceramic resonator, when the phase shifting circuit and the VCO are formed in an IC, no externally-attached part is required. As a result, since an adjustment of the frequency is completed in an IC device, setting makers (users of the IC) of FM receivers are not any convenience. In addition, since no special part such as the ceramic resonator is required, the circuit can be manufactured in countries where such a special part is not available.

Further, since the non-uniformities of the circuit elements of the phase shifting circuit and the VCO are eliminated by trimming the constant currents of the differential amplifiers constituting the oscillation differential amplifier of the phase shifting circuit and the VCO, the frequency trimming is easy, and the realization of an FM receiver requiring no regulation is facilitated.

Obviously, many modifications and variations of the present invention are possible in light of the above teachings. It is therefore to be understood that within the scope of the appended claims, the invention may be practiced other than as specifically described.

What is claimed is:

1. An FM signal processor comprising:

a multiplier for demodulating a stereo composite signal;

a first line for supplying the FM signal to the multiplier;

a second line for supplying an FM signal phase-shifted by 90° to the multiplier;

a 90° phase shifting circuit provided on the second line, said 90° phase shifting circuit having a first oscillation circuit whose phase shift amount varies according to a timing at which an amount of a current flowing through a charging and discharging capacitor is changed;

a multiplexer for processing the stereo composite signal demodulated by the multiplier to output left and right channel signals, said multiplexer having a second oscillation circuit of a voltage control type for generating a signal multiplied by the stereo composite signal to extract the left and right channel signals from the composite signal; and a trimming circuit for setting a constant current of a constant current source of a differential amplifier constituting a part of the first oscillation circuit and a constant current of a constant current source of a differential amplifier constituting a part of the second oscillation circuit, said trimming circuit being connected to the constant current source of each of the differential amplifiers.

2. An FM signal processor according to claim 1, wherein said trimming circuit constitutes a current mirror circuit having two output transistors, one of said two output transistors being connected to the constant current source of the first oscillation circuit and the other of said two output transistors being connected to the constant current source of the second oscillation circuit.

3. An FM signal processor according to claim 2, wherein an input transistor of the current mirror circuit is connected to output electrodes of a plurality of transistors through a plurality of conductors which can be cut off by a laser beam.

* * * * *